United States Patent [19]

Adachi

[11] Patent Number: 5,694,080

[45] Date of Patent: Dec. 2, 1997

[54] DELAY-TYPE FM DEMODULATION CIRCUIT

[75] Inventor: Michihiro Adachi, Tokyo, Japan

[73] Assignee: Kabushiki Kaisha Toshiba, Kawasaki, Japan

[21] Appl. No.: 731,485

[22] Filed: Oct. 16, 1996

[30] Foreign Application Priority Data

Oct. 19, 1995 [JP] Japan .................... 7-271190

[51] Int. Cl.$^6$ ................ H03D 3/00; H03D 3/06
[52] U.S. Cl. ................ 329/336; 360/30; 455/214
[58] Field of Search ................... 329/336, 337; 360/30; 455/214, 337

[56] References Cited

U.S. PATENT DOCUMENTS

| | | | |
|---|---|---|---|
| 4,064,361 | 12/1977 | Kustka et al. | 329/336 X |
| 4,320,525 | 3/1982 | Woodward | 329/336 X |
| 4,485,448 | 11/1984 | Kurth | 329/336 X |
| 4,549,143 | 10/1985 | Bouland et al. | 329/336 X |
| 4,656,432 | 4/1987 | Matsumura | 455/214 X |
| 5,185,679 | 2/1993 | Mishima et al. | 360/30 |

*Primary Examiner*—David Mis
*Attorney, Agent, or Firm*—Oblon, Spivak, McClelland, Maier & Neustadt, P.C.

[57] ABSTRACT

A delay-type FM demodulation circuit of this invention has an object to satisfactorily remove a harmonic wave in an arithmetic calculation output signal even if an LPF having relatively moderate stopping characteristics is used. The delay-type FM demodulation circuit includes first to third delay circuits for obtaining first to third signals obtained by times (e.g., $\frac{1}{8}$, $\frac{1}{4}$, and $\frac{3}{8}$) which sequentially increase within a time shorter than $\frac{1}{2}$ which is a signal period obtained when an FM-modulated input signal is positively deviated by a maximum frequency, a first multiplication circuit for multiplying the input signal and the first signal, a second multiplication circuit for multiplying the second signal and the third signal, and an addition circuit for adding an output signal from the first multiplication circuit and an output signal from the second multiplication circuit.

7 Claims, 9 Drawing Sheets

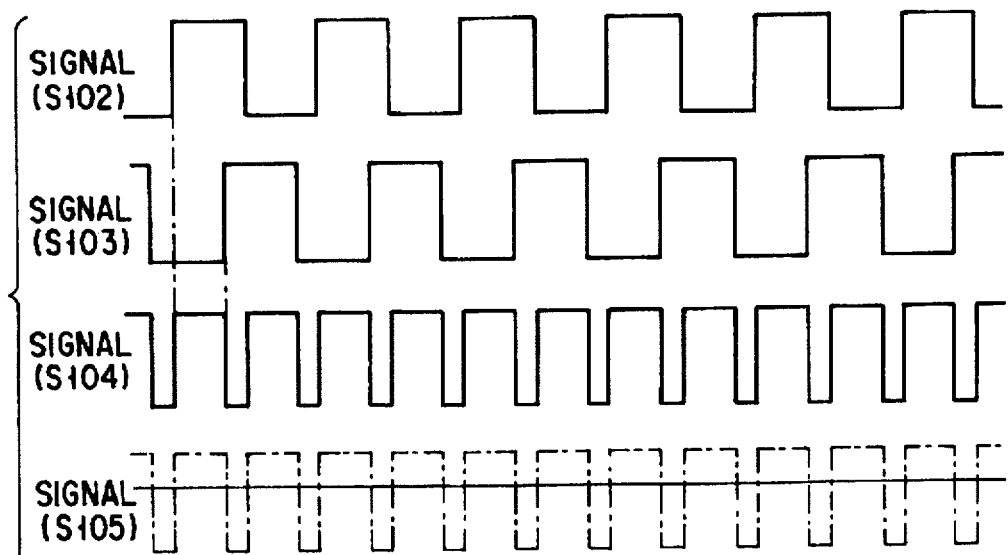
FIG. 4 PRIOR ART
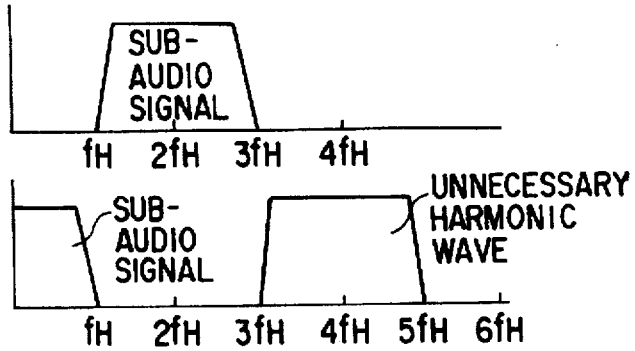
FIG. 5A PRIOR ART
FIG. 5B PRIOR ART
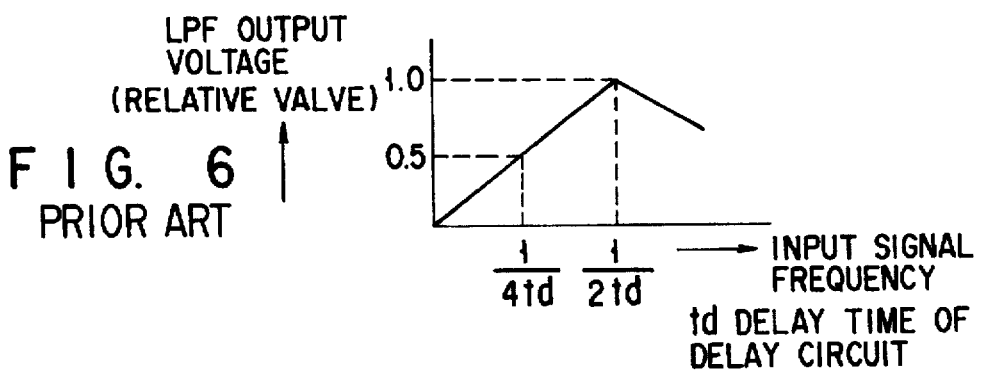
FIG. 6 PRIOR ART
td DELAY TIME OF DELAY CIRCUIT
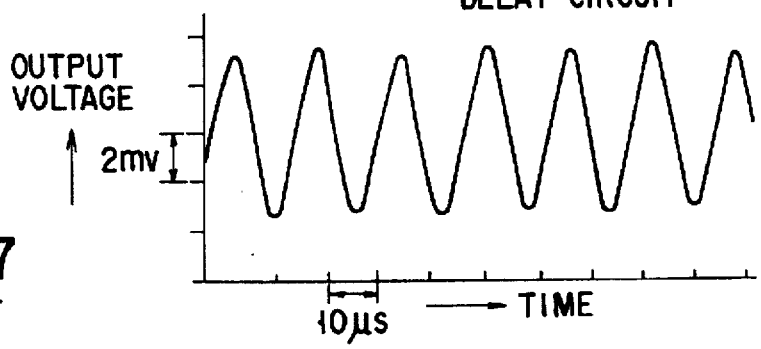
FIG. 7 PRIOR ART

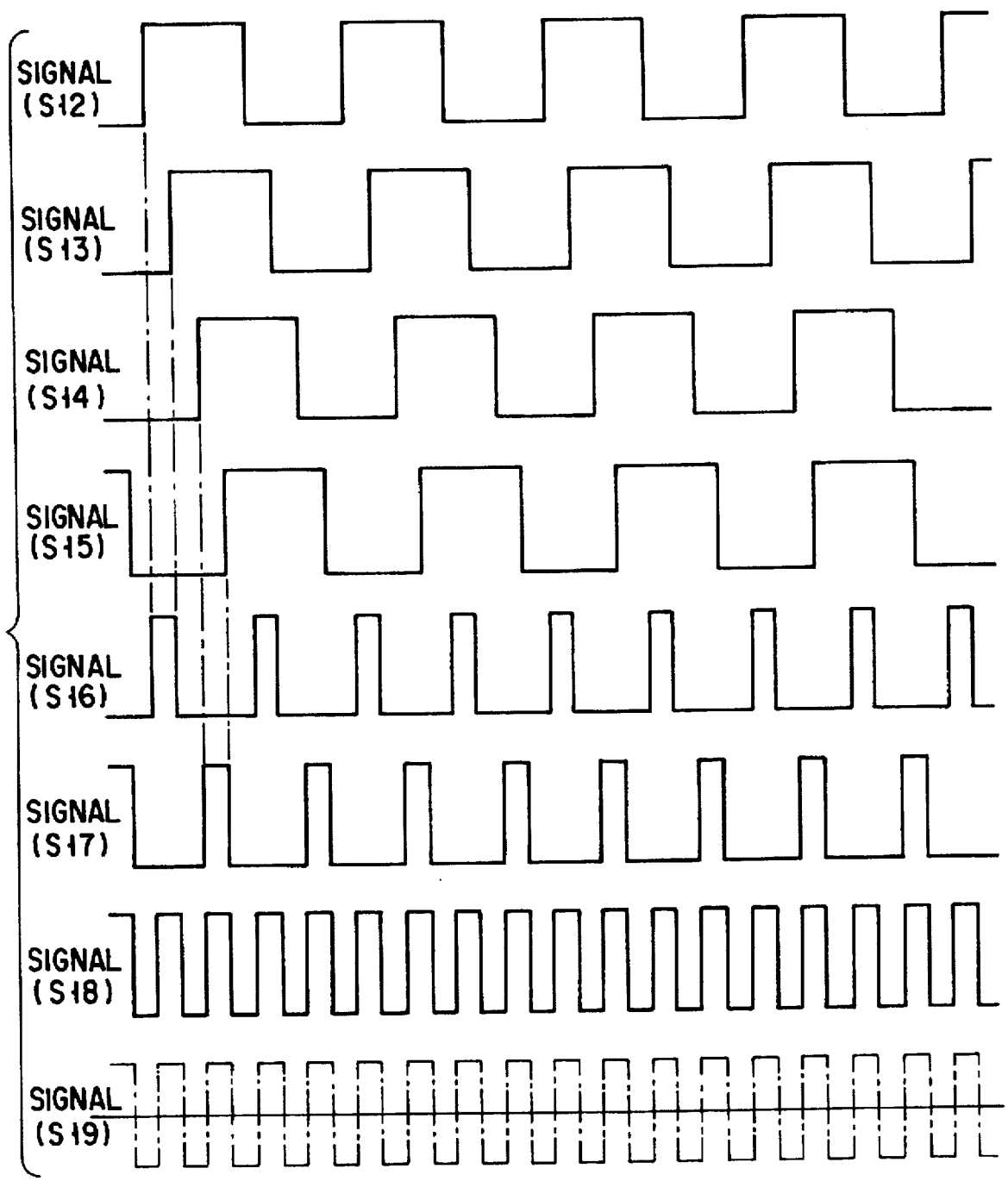
F I G. 11

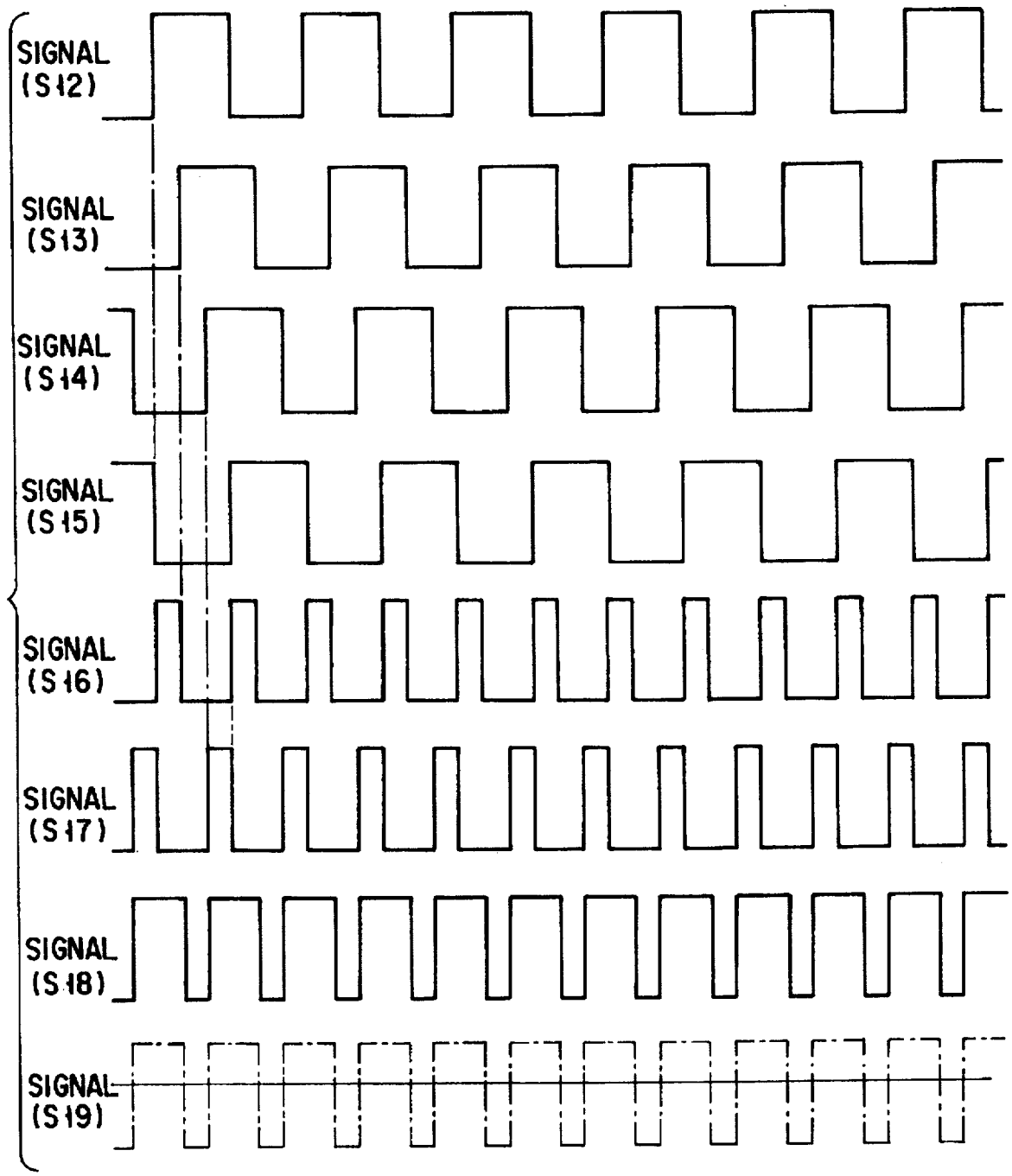
F I G. 13

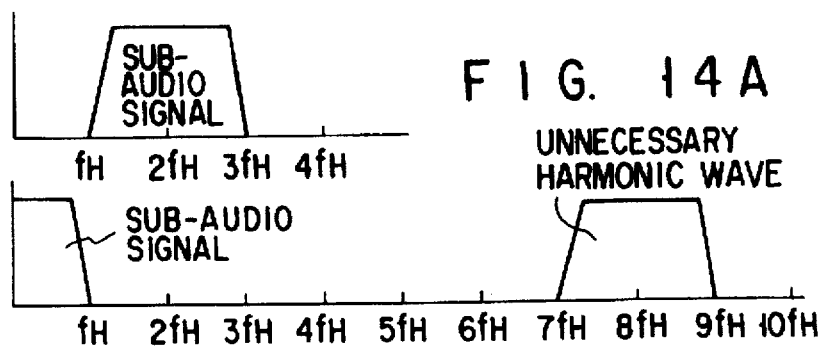
FIG. 14A
FIG. 14B
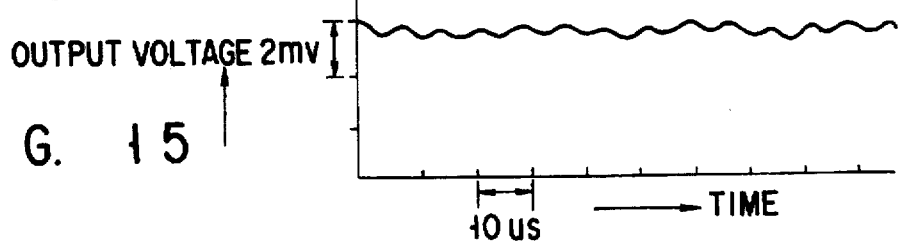
FIG. 15
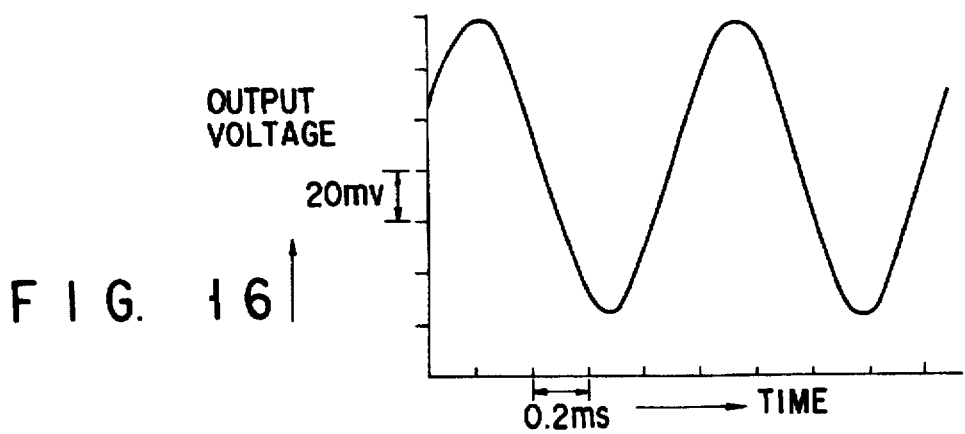
FIG. 16
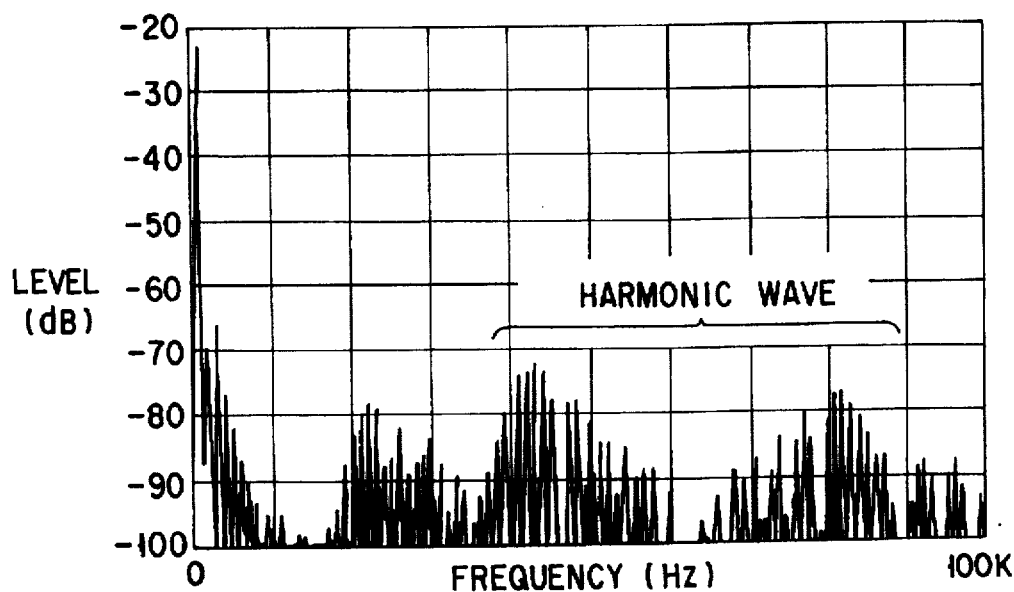
FIG. 17

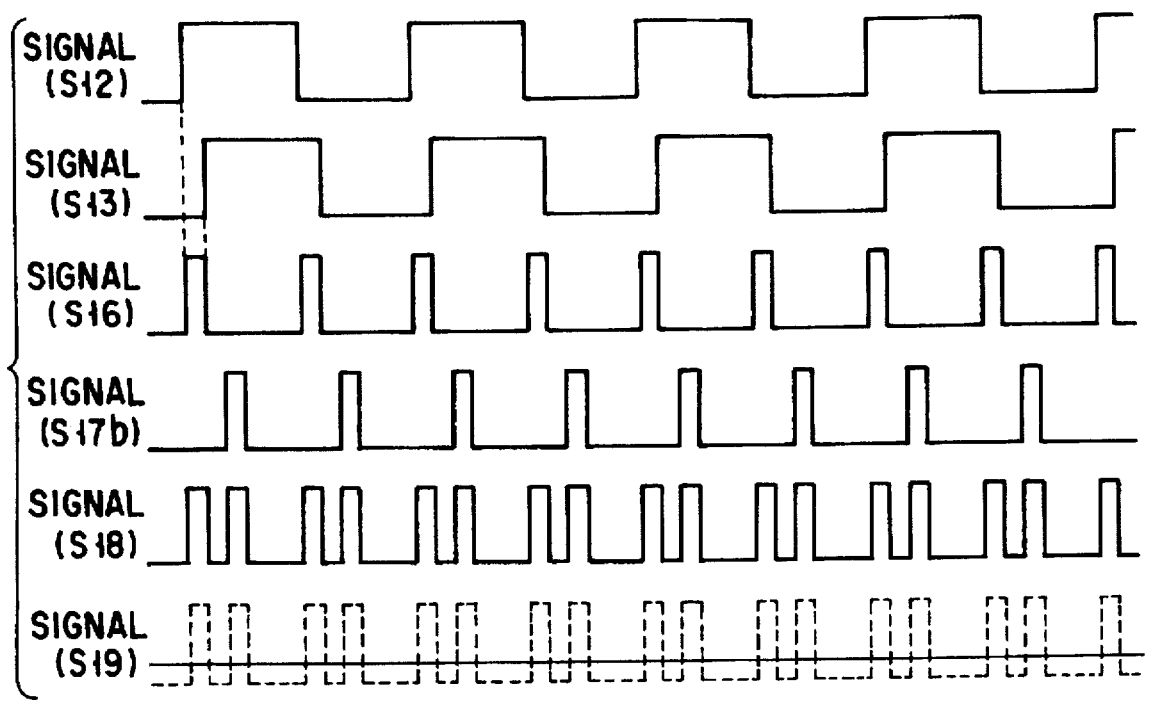
F I G. 21
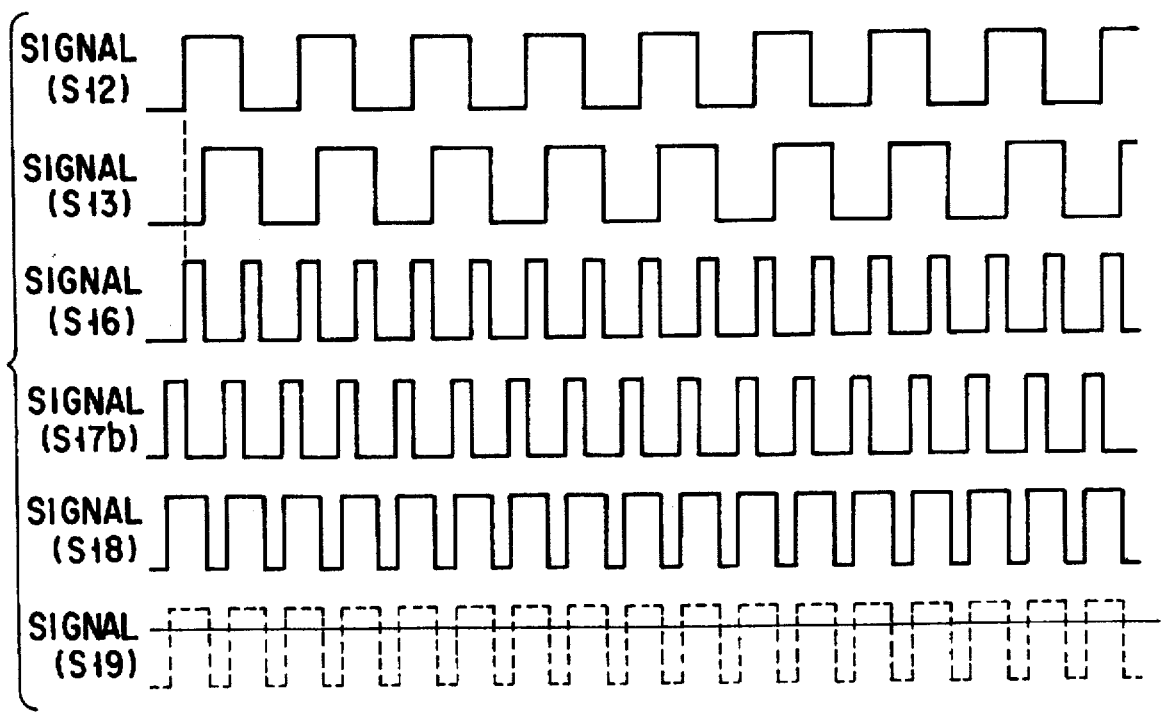
F I G. 22

DELAY-TYPE FM DEMODULATION CIRCUIT

BACKGROUND OF THE INVENTION

1. Field of the Invention

The present invention relates to an FM demodulation circuit and, more particularly, to a delay-type FM demodulation circuit for use in, e.g., an EIAJ (Electronic Industry Association of JAPAN standard) TV sound multiplex broadcast receiving apparatus or a home-use VCR reproducing apparatus.

2. Description of the Related Art

A delay-type FM demodulation circuit shown in FIG. 1 is generally used to modulate an FM signal having a band occupation rate with respect to the frequency of a carrier wave signal, i.e., a sub-audio signal of an EIAJ standard TV (television) sound multiplex broadcast or a luminance recording signal of a home-use VCR (Video Cassette Recorder).

In the delay-type FM demodulation circuit shown in FIG. 1, reference numeral 101 denotes a limiter amplifier (amplitude limit amplification circuit); 102, a first delay circuit; 103, multiplication circuit; and 104, an LPF (Low Pass Filter).

FIG. 2 shows waveforms of respective parts for explaining an operation performed when a time which is a quarter of an input signal period is equal to the delay time of the delay circuit in the delay-type FM demodulation circuit in FIG. 1.

FIG. 3 shows waveforms of respective parts for explaining an operation performed when an input frequency is lower than the frequency shown in FIG. 2 in the delay-type FM demodulation circuit in FIG. 1.

FIG. 4 shows waveforms of respective parts for explaining an operation performed when an input frequency is higher than the frequency shown in FIG. 2 in the delay-type FM demodulation circuit in FIG. 1

The operation principle of FM demodulation in the delay-type FM demodulation circuit in FIG. 1 will be described below with reference to the waveform charts shown in FIGS. 2 to 4 by using, as an example, a case wherein a sub-audio signal (FM signal) included in a reception signal of an EIAJ standard TV sound multiplex broadcast is input as shown in FIG. 5A.

An FM-modulated input signal (FM signal) (S101) has its waveform shaped by the limiter amplifier 101 and is then divided into two signals. The first signal (S102) is directly input to the multiplication circuit 103. The second signal is delayed by a predetermined time by the first delay circuit 102. The delayed signal (S103) is input to the multiplication circuit 103. The circuit 103 multiplies two input signals, generating a multiplication output signal (S104). The duty ratio of the output signal (S104) changes in proportion to the input frequency as long as the period of the input signal is twice or more the delay time.

In a conventional delay-type FM demodulation circuit, since an input signal is multiplied by a signal obtained by delaying the input signal by a predetermined time, the multiplication output signal (S104) has a harmonic wave having a wave which is twice the input signal as a fundamental wave as shown in FIG. 5B.

When the LPF (low pass filter) 104 smoothens the multiplication output signal (S104), a signal voltage (S105) which is in proportion to the duty ratio of the multiplication output signal (S104) is generated. More specifically, when the LPF 104 removes the harmonic wave which is twice the input signal, an FM demodulation signal (sub-audio signal) can be obtained which is proportional to the input signal frequency.

Although the delay time of the delay circuit has such an arbitrarily value, in a range in which the input signal period is twice or less the delay time, as shown in FIG. 6, an FM demodulation output voltage is not in proportion to the input frequency. Therefore, to perform FM demodulation without any distortion, the delay time of the delay circuit must be shorter than half the period of a signal obtained when the input signal is positively deviated by the maximum frequency. If the delay time is a quarter of a carrier wave period, the range in which FM demodulation can be performed without any distortion is maximum. For this reason, the delay time is designed to be a quarter of the carrier wave period.

When a signal such as a sub-audio signal used in the EIAJ standard TV sound multiplex broadcast receiving apparatus or a luminance recording signal used in a home-use VCR reproducing apparatus having a broad band occupation rate has a frequency higher than that of a carrier wave, the frequency of the high-frequency component of a demodulated signal and the frequency of the low-frequency component of a harmonic wave are close to each other For this reason, an LPF having sharp stopping characteristics is required to remove the harmonic wave without attenuating the high-frequency component of the demodulated signal.

However, since the LPF having sharp stopping characteristics generally has its phase characteristics which considerably changed, it cannot be used in the signal processing circuit of a VCR, which processes a video signal or in a sound multiplex demodulation circuit which arithmetically processes a main audio signal and a sub-audio signal to demodulate stereo sound.

The LPF 104 actually used has characteristics set by trade-off between the stopping characteristics and the phase characteristics. Since the LPF 104 cannot have satisfactorily stopping characteristics, a harmonic wave leaks on the LPF output side.

FIG. 7 is a waveform showing how a harmonic wave leaks when a conventional delay-type FM demodulation circuit is used to perform sub-audio demodulation in an EIAJ standard TV sound multiplex broadcast. In this case, the delay time of a delay circuit is a quarter of the carrier wave period, the input signal has a frequency of 1 kHz, no modulation is performed, and primary LPFS having cut-off frequencies of 15.734 kHz and 2.12 kHz are connected in cascade to the output terminal of a multiplication circuit. As seen from the waveform in FIG. 7, a harmonic wave leaks.

FIGS. 8 and 9 show the waveform and frequency spectrum of a demodulation output obtained when a conventional delay-type FM demodulation circuit is used for sub-audio demodulation of an EIAJ standard TV sound multiplex broadcast. In this case, the delay time of a delay circuit is a quarter of a carrier wave period, the input signal has a frequency of 1 kHz, the modulation factor is 100%, and primary LPFS having cut-off frequencies of 15.734 kHz and 2.12 kHz are connected in cascade to the output terminal of a multiplication circuit. As can be understood from the waveform in FIGS. 8 and 9, a harmonic wave leaks.

SUMMARY OF THE INVENTION

As described above, a conventional delay-type FM demodulation circuit requires an LPF having sharp stopping characteristics to remove a harmonic wave without attenuating the high-frequency component of a demodulation signal included in a multiplication output signal. However, an actually used LPF has characteristics which are set by trade-off between stopping characteristics and phase characteristics, the stopping characteristics of the LPF cannot be satisfactorily assured. For this reason, a harmonic wave disadvantageously leaks on the LPF output side.

The present invention has been made to solve the above problem, and has as its object to provide a delay-type FM demodulation circuit in which the frequency of a harmonic wave of a demodulation signal included in a calculation output signal can be converted into a high frequency, and a harmonic wave can be satisfactorily removed even if an LPF having relatively moderate stopping characteristics is used.

According to the present invention, there is provided a delay-type FM demodulation circuit comprising: first means for obtaining a first signal delayed from a FM-modulated input signal by a time shorter than a times T which is half a signal period obtained when the input signal is positively deviated by a maximum frequency; second means for obtaining within a time shorter than T a second signal which is delayed by a time longer than the delay time of the first signal; third means for obtaining within a time longer than T a third signal which is delayed with respect to the input signal by a time longer than the delay time of the second signal; a first multiplication circuit for multiplying the input signal and the first signal; a second multiplication circuit for multiplying the second signal and the third signal; and an adding circuit for adding an output signal from the first multiplication circuit and an output signal from the second multiplication circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 shows waveforms of respective parts for explaining an operation performed when an input frequency is higher than the frequency shown in FIG. 2 in the conventional delay-type FM demodulation circuit;

FIGS. 5A and 5B are graphs showing frequency bands of an input signal and an output signal when a sub-audio signal included in an EIAJ standard TV sound multiplex broadcast signal is input to the conventional delay-type FM demodulation circuit;

FIG. 6 is a graph showing the relationship between an input signal frequency and an FM demodulation output voltage in the conventional delay-type FM demodulation circuit;

FIG. 7 is a graph showing a manner of leakage of a harmonic wave obtained when the conventional delay-type FM demodulation circuit is used for sub-audio demodulation in an EIAJ standard TV sound multiplex broadcast;

FIG. 11 is a waveform chart showing waveforms of respective parts for explaining an operation in the delay-type FM demodulation circuit in FIG. 10;

FIG. 13 is a waveform chart showing waveforms of respective parts for explaining an operation performed when an input frequency is higher than a frequency shown in FIG. 11 in the delay-type FM demodulation circuit in FIG. 10;

FIGS. 14A and 14B are graphs showing the frequency bands of input and output signals obtained when a sub-audio signal included in an EIAJ standard TV Sound multiplex broadcast signal is input to the delay-type FM demodulation circuit in FIG. 10;

FIG. 15 is a graph showing a manner of leakage of a harmonic wave obtained when the delay-type FM demodulation circuit in FIG. 10 is used for sub-audio. demodulation in an EIAJ standard TV sound multiplex broadcast;

FIG. 16 is a graph showing a demodulation output obtained when the delay-type FM demodulation circuit in FIG. 10 is used for sub-audio demodulation in an EIAJ standard TV sound multiplex broadcast;

FIG. 17 is a graph showing the frequency spectrum of the demodulation output obtained when the delay-type FM demodulation circuit in FIG. 10 is used for sub-audio demodulation of an EIAJ standard TV sound multiplex broadcast;

FIG. 21 is a waveform chart showing waveforms of respective parts for explaining an operation performed when an input frequency is lower than a frequency shown in FIG. 20 in the delay-type FM demodulation circuit in FIG. 19; and FIG. 22 is a waveform chart showing waveforms of respective parts for explaining an operation performed when an input frequency is higher than a frequency shown in FIG. 20 in the delay-type FM demodulation circuit in FIG. 19.

DETAILED DESCRIPTION OF THE PREFERRED EMBODIMENTS

Embodiments of the present invention will be described below with reference to the accompanying drawings.

Figure 10:
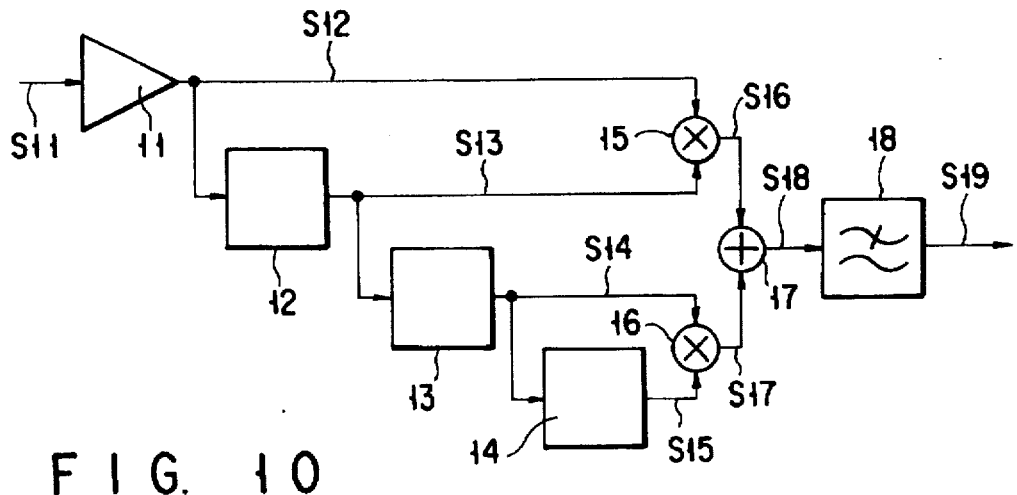
FIG. 10 is a block diagram showing a delay-type FM demodulation circuit according to the first embodiment of the present invention.

FIG. 10 shows a delay-type FM demodulation circuit according to the first embodiment of the present invention. In the delay-type FM demodulation circuit in FIG. 10, reference numeral 11 denotes a limiter amplifier (amplitude limit amplification circuit) for performing amplitude limit amplification to an input signal (S11).

Reference numeral 12 denotes a first delay circuit for delaying an output signal (S12) from the limiter amplifier by a predetermined time to obtain a first delay signal (S13). Reference numeral 13 denotes a second delay circuit for delaying the output signal (S13) from the first delay circuit to obtain a second delay signal (S14). Reference numeral 14 denotes a third delay circuit for delaying the output signal (S14) from the second delay circuit by a predetermined time to obtain a third delay signal (S15).

Reference numeral 15 denotes a first multiplication circuit for multiplying the output signal (S12) from the limiter amplifier and the first delay signal (S13); reference numeral 16 denotes a second multiplication circuit for multiplying the second delay signal (S14) and the third delay signal (S15); and reference numeral 17 denotes an adding circuit for adding an output signal (S16) from the first multiplication circuit 15 and an output signal (S17) from the second multiplication circuit 16.

Reference numeral 18 denotes an LPF (low pass filter) for receiving an output signal (S18) from the adding circuit 17 to remove an unnecessary harmonic wave.

More specifically, the delay-type FM demodulation circuit in FIG. 10 generates first to third signals which are delayed from an input signal by a time (as will be described later, for example, ⅛, ¼, or ⅜ is preferable) which is gradually elongated within a time shorter than ½ a signal period obtained when an FM-modulated input signal is positively deviated. In this state, the input signal and the first signal are multiplied by means of the first multiplication circuit 15, and the second signal and the third signal are multiplied by means of the second multiplication circuit 16, and an output signal from the first multiplication circuit and an output signal from the second multiplication circuit are added to each other by means of the adding circuit 17.

FIG. 11 shows waveforms of respective parts for explaining an operation in the delay-type FM demodulation circuit in FIG. 10.

Figure 12:
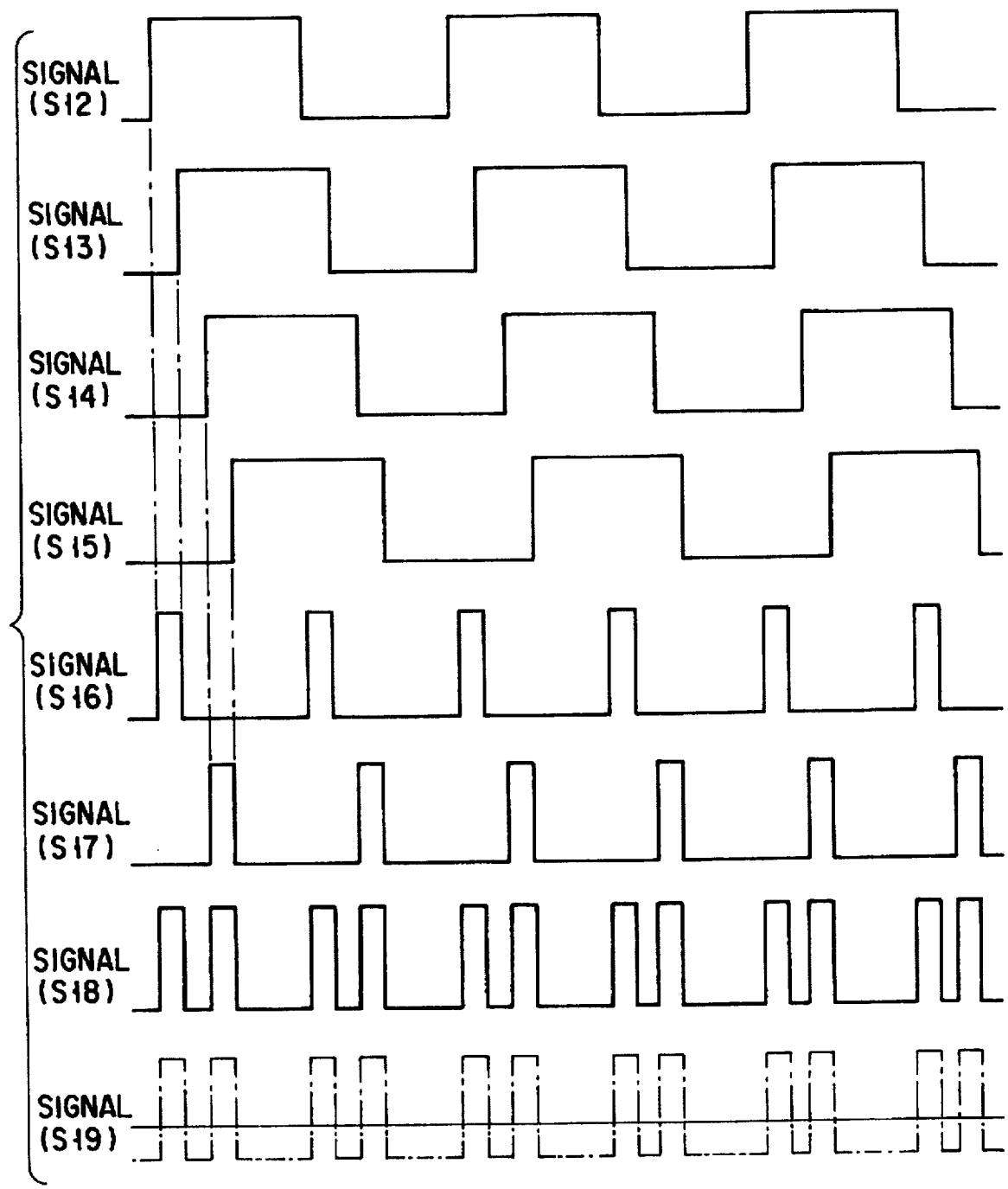
FIG. 12 is a waveform chart showing waveforms of respective parts for explaining an operation performed when an input frequency is lower than a frequency shown in FIG. 11 in the delay-type FM demodulation circuit in FIG. 10.

FIG. 12 shows waveforms of respective parts for explaining an operation performed when the frequency of the input signal is lower than the frequency of the input signal in FIG. 11 in the delay-type FM demodulation circuit in FIG. 10. FIG. 13 shows waveforms of respective parts for explaining an operation performed when the frequency of the input Signal is higher than the frequency of the input signal in FIG. 11 in the delay-type FM demodulation circuit in FIG. 10.

An operation principle of FM demodulation in the delay-type FM demodulation circuit in FIG. 10 will be described below with reference to the waveform charts shown in FIGS. 11 to 13 by using, as an example, a case wherein a sub-audio signal (FM signal) included in a reception signal of an EIAJ standard TV sound multiplex broadcast is input as shown in FIG. 5A.

An FM-modulated FM signal input (S11) is waveform-shaped by the limiter amplifier 11 and then branched into two signals. One signal (S12) is directly input to the first multiplication circuit 15, and the other signal is input to the first delay circuit 12. The first delay circuit 12 outputs the first delay signal (S13) obtained by delaying the input signal by a predetermined time. The output signal from the first delay circuit 12 is branched into two signals. One signal is directly input to the first multiplication circuit 15, and the other signal is input to the second delay circuit 13. The second delay circuit 13 outputs the second delay signal (S14) obtained by delaying the input signal by a predetermined time. An output signal from the second delay circuit 13 is branched into two signals, one signal (S14) is directly input to the second multiplication circuit 16, and the other signal is input to the third delay circuit 14. The third delay circuit 14 outputs the third delay signal (S15) obtained by delaying the input signal by a predetermined time to input it to the second multiplication circuit 16.

The first multiplication circuit 15 multiplies two input signals to obtain a first multiplication output signal (S16). The second multiplication circuit 16 multiplies two input signals to obtain a second multiplication output signal (S17).

In this manner, the duty ratio of the first multiplication output signal (S16) is in proportion to the frequency of the input signal, and the duty ratio of the second multiplication output signal (S17) is also in proportion to the frequency of the input signal. In this case, the second multiplication output signal (S17) is delayed from the first multiplication output signal (S16) by the delay time of the second delay circuit 13.

The adding circuit 17 adds the first multiplication output signal (S16) and the second multiplication output signal (S17) to obtain an addition output signal (S18). Since both the signals (S16) and (S17) have duty ratios which are in proportion to the frequency of the input signal, the addition output signal (S18) also has a duty ratio which is in proportion to the frequency of the input signal.

The first multiplication output signal (S16) and the second multiplication output signal (S17) include harmonic waves which are twice the input signal, and the second multiplication output signal (S17) is delayed from the first multiplication output signal (S16) by the delay time of the second delay circuit 13. For this reason, the harmonic waves which are included in the first multiplication output signal (S16) and the second multiplication output signal (S17) and twice the input signal are partially converted into harmonic waves which four times the input signal.

When the additioned output signal (S18) is smoothed by the LPF 18, an FM demodulation signal (sub-audio signal) is obtained, which is in proportion to the frequency of the input signal.

As described above, since the harmonic wave which is included in the additioned output signal (S18) and is twice frequency of the input signal is decreased by a harmonic wave component which is converted into the harmonic wave which is four times the input signal frequency, when an LPF having the same stopping characteristics as those of the LPF inserted into the multiplication circuit output in a conventional delay-type FM demodulation circuit is used, leakage of a harmonic wave can be smaller than that in the conventional delay-type FM demodulation circuit.

Assume that the delay times of the first delay circuit 12, the second delay circuit 13, and the third delay circuit 14 are set to be ⅛ a carrier wave period. In this case, when the input signal frequency is equal to the carrier wave cycle, the harmonic wave included in the addition output signal (S18) is only a harmonic component which is four times the input signal frequency. As a result, the harmonic component which is twice the input signal frequency is completely removed, and detection efficiency is maximum.

FIG. 15 is a waveform showing a manner of leakage of a harmonic wave obtained when the delay-type FM demodulation circuit in FIG. 10 is used for sub-audio demodulation in an EIAJ standard TV sound multiplex broadcast. In this case, conditions are set as follows. That is, the delay times of all the delay circuits are ⅛ a carrier wave period, an input signal is not modulated, and a primary LPF having a cut-off frequency of 15.734 kHz and a primary LPF having a cut-off frequency of 2.12 kHz are connected in cascade to the output terminal of the multiplication circuit.

As is apparent from the waveform in FIG. 15, leakage of a harmonic wave is smaller than the leakage of the harmonic wave shown in FIG. 7, in which the conventional delay-type FM demodulation circuit is used, by about 22 dB.

FIG. 16 shows the waveform of a demodulation output obtained when the delay-type FM demodulation circuit shown in FIG. 10 is used for sub-audio demodulation in EIAJ standard TV sound multiplex broadcast. In this case, conditions are set as follows. That is, the delay times of all the delay circuits are ⅛ a carrier wave period, an input signal has a frequency of 1 kHz, a modulation factor is 100%, and a primary LPF having a cut-off frequency of 15.734 kHz and a primary LPF having a cut-off frequency of 2.12 kHz are connected in cascade to the output terminal of the multiplication circuit.

Figure 1:
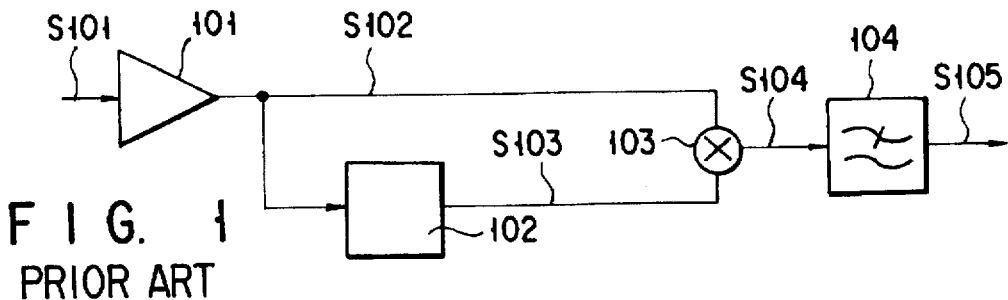
FIG. 1 is a block diagram showing a conventional FM demodulation circuit.
Figure 2:
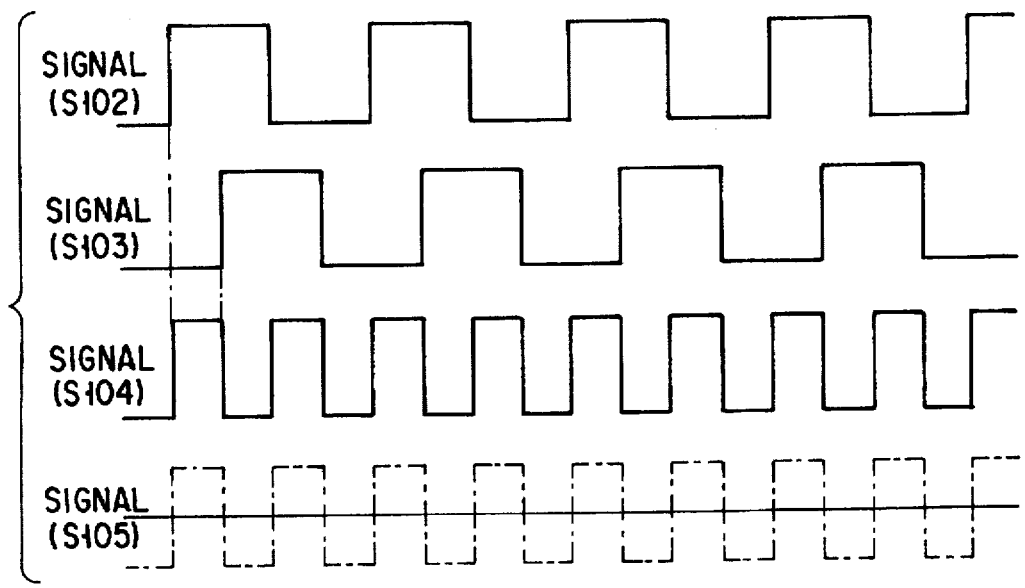
FIG. 2 is a waveform chart showing waveforms of respective parts for explaining an operation in the conventional delay-type FM demodulation circuit.
Figure 3:
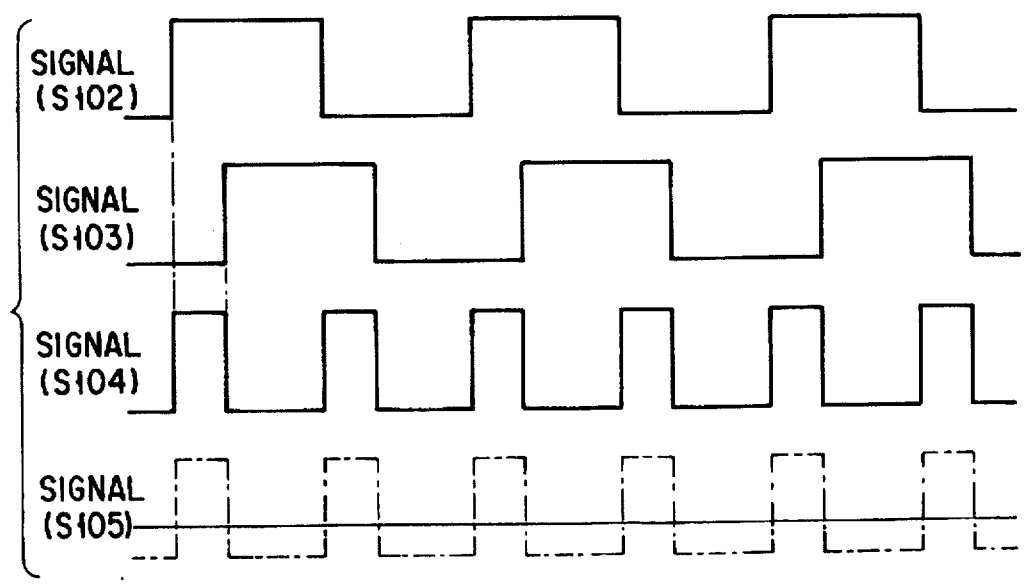
FIG. 3 is a waveform chart showing waveforms of respective parts for explaining an operation performed when an input frequency is lower than the frequency shown in FIG. 2 in the conventional delay-type FM demodulation circuit.
Figure 8:
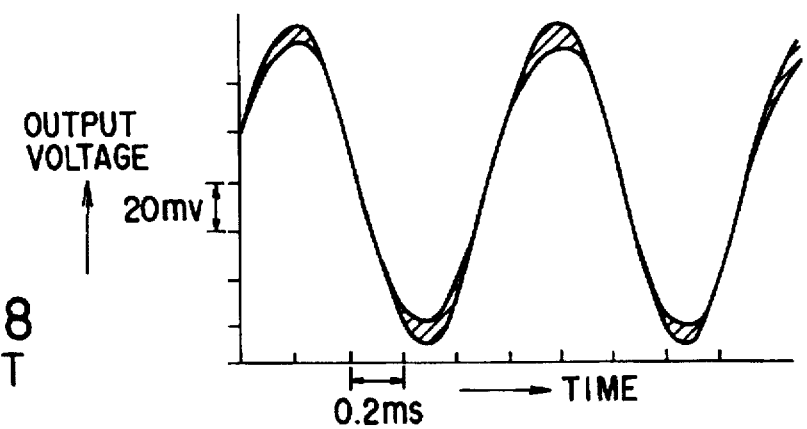
FIG. 8 is a graph showing a demodulation output obtained when the conventional delay-type FM demodulation circuit is used for sub-audio demodulation in an EIAJ standard TV sound multiplex broadcast.

As is apparent from FIG. 16, leakage of a harmonic wave for a demodulation output is smaller than that in the characteristics shown in FIG. 8 in which the conventional delay-type FM demodulation circuit is used.

Figure 9:
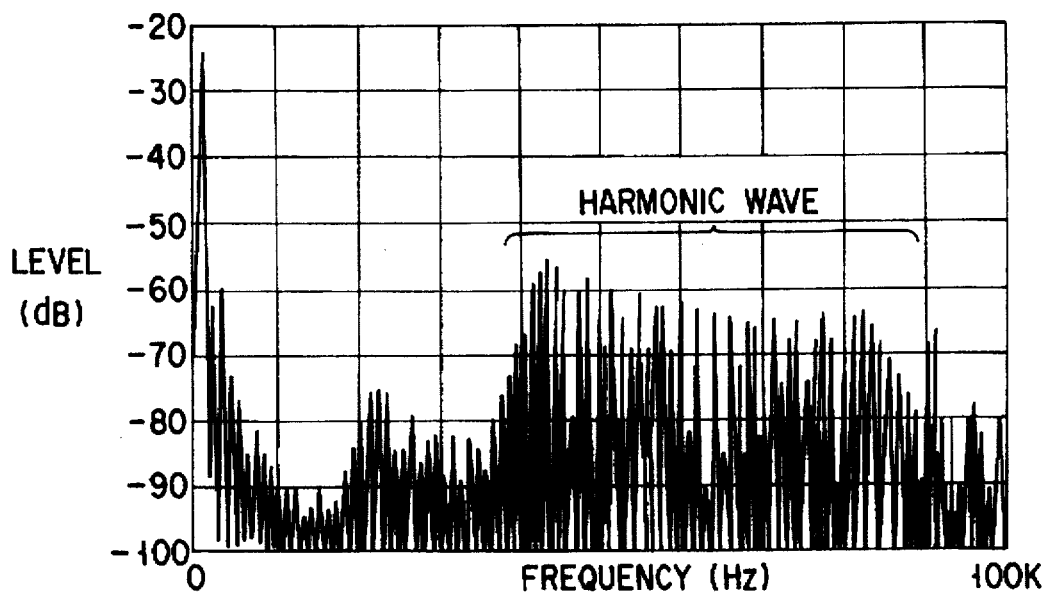
FIG. 9 is a graph showing the frequency spectrum of the demodulation output obtained when the conventional delay-type FM demodulation circuit is used for sub-audio demodulation of an EIAJ standard TV sound multiplex broadcast.

FIG. 17 shows the frequency spectrum of the demodulation output shown in FIG. 16. As is apparent from FIG. 17, this frequency spectrum has a harmonic wave up to 100 kHz which is smaller than that of the frequency spectrum of the demodulation output shown in FIG. 9, in which the conventional delay-type FM demodulation circuit is used, by about 15 dB as a whole. In particular, the harmonic wave of a portion corresponding to a frequency which is twice the carrier wave frequency is decreased by 30 dB or more. Since the input signal is FM-modulated, and instantaneously has a frequency which is not equal to the carrier wave frequency, a component having a frequency which is twice the input signal frequency of this portion cannot be completely removed. However, since almost all components can be converted into components each having a frequency which is four times the input signal frequency where input signal has a frequency which is close to the carrier wave frequency, leakage of the harmonic wave decreases as a whole.

Figure 18:
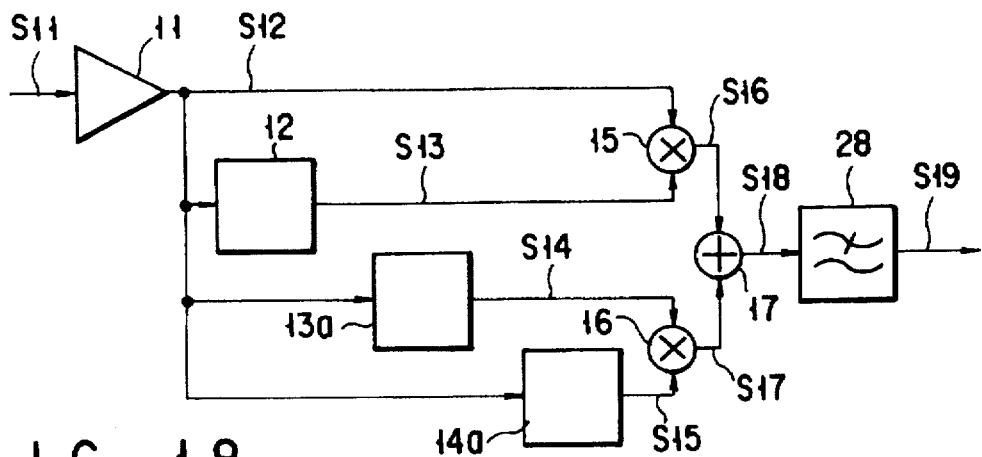
FIG. 18 is a block diagram showing a delay-type FM demodulation circuit according to the second embodiment of the present invention.

FIG. 18 shows a delay-type FM demodulation circuit according to the second embodiment of the present invention.

The delay-type FM demodulation circuit in FIG. 18 is the same as the delay-type FM demodulation circuit shown in FIG. 10 except for a second delay means and a third delay means. For this reason, the same reference numerals as in FIG. 10 denote the same parts in FIG. 18, and a description thereof will be omitted.

More specifically, as the second delay means for obtaining the second signal, a second delay circuit 13a which receives an output signal (S12) from the limiter amplifier 11 and delays the signal by a predetermined time is used. As the third delay means for obtaining the third signal, a third delay circuit 14a which receives an output signal (S12) from the limiter amplifier 11 and delays the signal by a predetermined time is used.

The operation of the delay-type FM demodulation circuit in FIG. 18 is basically the same as the operation of the delay-type FM demodulation circuit in FIG. 10 except for methods of generating the second and third signals.

In the delay-type FM demodulation circuit in FIG. 18, assume that the delay time of a first delay circuit 12 is set to be ⅛ of a carrier wave period, that the delay time of the second delay circuit 13a is set to be ¼ the carrier wave period, and that the delay time of the third delay circuit 14a is set to be ⅜ the carrier wave period. In this case, when the frequency of the input signal is equal to the frequency of the carrier wave, a harmonic wave included in an additioned output signal (S18) is only a harmonic component which is four times an input signal frequency, a harmonic component which is twice the input signal frequency is completely removed, and detection efficiency is maximum.

Figure 19:
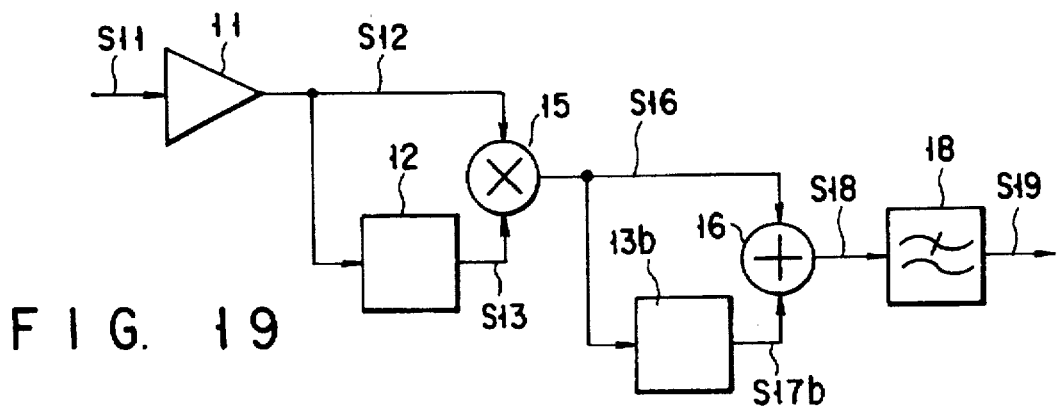
FIG. 19 is a block diagram showing a delay-type FM demodulation circuit according to the third embodiment of the present invention.

FIG. 19 shows a delay-type FM demodulation circuit according to the third embodiment of the present invention. In the delay-type FM demodulation circuit in FIG. 19, reference numeral 11 denotes a limiter amplifier (amplitude limit amplification circuit) for performing amplitude limit amplification to an FM-modulated input signal (S11) as in the first embodiment.

Reference numeral 12 denotes a first delay circuit for delaying an output signal (S12) from the limiter amplifier by a predetermined time to obtain a first delay signal (S13). Reference numeral 15 denotes a multiplication circuit for multiplying the output signal (S12) from the limiter amplifier and the first delay signal (S13) to obtain an output signal (S15). Reference numeral 13b denotes a second delay circuit for delaying an output signal (S16) from the multiplication circuit by a predetermined time to obtain a second delay signal (S17b). Reference numeral 16 denotes an addition circuit for adding the output signal (S16) from the first multiplication circuit 15 and the output signal (S17b) from the second delay circuit 13b. Reference numeral 18 denotes an LPF (low pass filter) which receives an output signal (S18) from the addition circuit 16 to remove an unnecessary harmonic wave.

Figure 20:
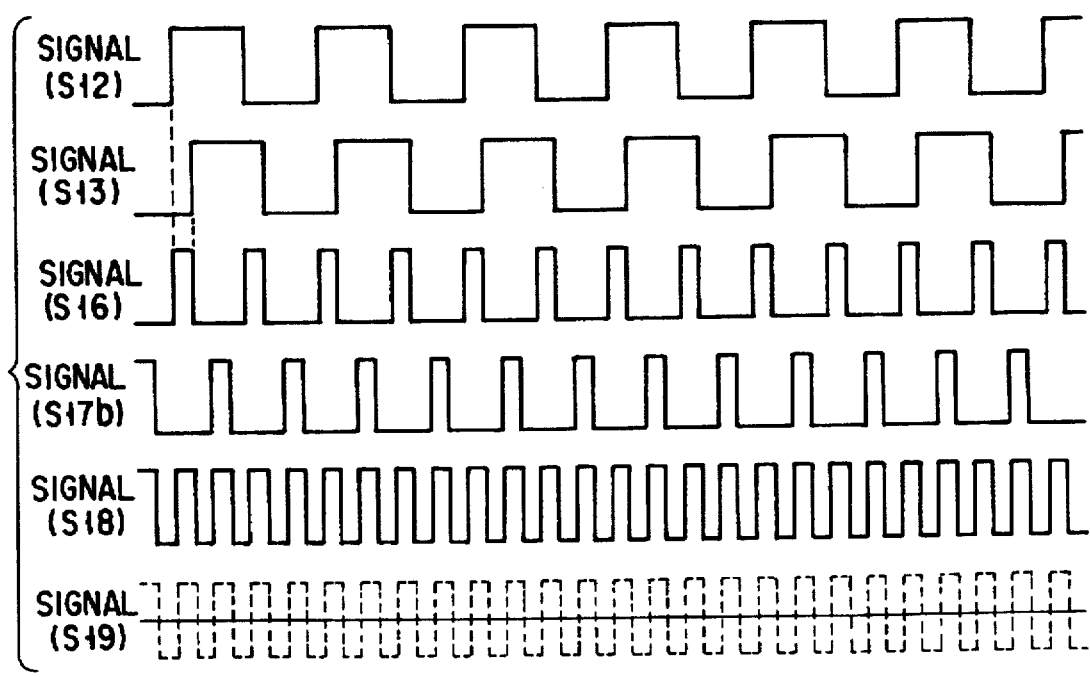
FIG. 20 is a waveform chart showing waveforms of respective parts for explaining an operation in the delay-type FM demodulation circuit in FIG. 19.

More specifically, in the delay-type FM demodulation circuit in FIG. 19 causes the first delay circuit to delay the first delay signal by a time shorter than a time which is ¼ a signal period obtained when the FM-modulated input signal is positively deviated by the maximum frequency. The second delay circuit delays the output signal from the first multiplication circuit by a time shorter a time obtained by subtracting the delay time of the first delay circuit from the time which is ¼ the signal period. FIG. 20 shows waveforms of respective parts for explaining an operation in the delay-type FM demodulation circuit in FIG. 19. In this case, the delay times of the first and second delay circuits are ⅛ the carrier wave period of the input signal. In this case, when the input signal frequency is equal to the carrier wave frequency, a harmonic wave included in the additioned output signal (S18) is only a harmonic component which is four times the input signal frequency. For this reason, a harmonic component which is twice the input signal frequency is completely removed, and detection efficiency is maximum.

FIG. 21 shows waveforms of respective parts for explaining an operation performed when the frequency of an input frequency is lower than the frequency of the input signal in FIG. 20 in the delay-type FM demodulation circuit in FIG. 19. FIG. 22 shows waveforms of respective parts for explaining an operation performed when the frequency of an input frequency is higher than the frequency of the input signal in FIG. 20 in the delay-type FM demodulation circuit in FIG. 19.

As has been described above, according to the delay-type FM demodulation circuit of the present invention, the frequency of the harmonic wave of a demodulation signal included in an arithmetic calculation output signal can be shifted up. Even if an LPF having relatively moderate stopping characteristics is used, harmonic wave removal can be satisfactorily performed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A delay-type FM demodulation circuit comprising:
   first means for obtaining a first signal delayed from a FM-modulated input signal by a time shorter than a time T which is half a signal period obtained when the input signal is positively deviated by a maximum frequency;
   second means for obtaining within a time shorter than T a second signal which is delayed by a time longer than the delay time of the first signal;
   third means for obtaining within a time shorter than T a third signal which is delayed with respect to the input signal by a time longer than the delay time of the second signal;
   a first multiplication circuit for multiplying the input signal and the first signal;
   a second multiplication circuit for multiplying the second signal and the third signal; and
   an adding circuit for adding an output signal from said first multiplication circuit and an output signal from said second multiplication circuit.

2. A delay-type FM demodulation circuit according to claim 1, wherein said first means is a first delay circuit for delaying the input signal by a time shorter than T; said second means is a second delay circuit having an input connected to an output of said first delay circuit, for obtaining within a time shorter than T a second signal delayed with respect to the input signal by a time longer than the delay time of the first signal; and said third means is a third delay circuit having an input connected to an output of said second delay circuit, for obtaining within a time shorter than T a third signal delayed with respect to the input signal by a time longer than the delay time of the second signal.

3. A delay-type FM demodulation circuit according to claim 1, wherein said first means is a first delay circuit for delaying the input signal by an arbitrary time which is shorter than T; said second means is a second delay circuit having an input connected to an input of said first delay circuit, for obtaining within a time shorter than T a second signal delayed with respect to the input signal by a time longer than the delay time of the first signal; and said third means is a third delay circuit having an input connected to an input of said first delay circuit, for obtaining within a time shorter than T third signal delayed from the input signal by an arbitrary time longer than the delay time of the second signal.

4. An delay-type FM demodulation circuit according to claim 2, wherein
   said first means is a first delay circuit for delaying the input signal by a time which is ⅛ a carrier wave period, said second means is a second delay circuit for delaying the first signal by a time which is ⅛ the carrier wave period, and said third means is a third delay circuit for delaying the second signal by a time which is ⅛ the carrier wave period.

5. An delay-type FM demodulation circuit according to claim 3, wherein
   said first means is a first delay circuit for delaying the input signal by a time which is ⅛ a carrier wave period, said second means is a second delay circuit for delaying the input signal by a time which is ¼ the carrier wave period, and said third means is a third delay circuit for delaying the input signal by a time which is ⅜ the carrier wave period.

6. A delay-type FM demodulation circuit comprising:
   first means for obtaining a first signal which is delayed from a FM-modulated input signal by an arbitrary time which is shorter than a time T which is a quarter of a signal period obtained when the input signal is positively deviated by a maximum frequency;
   multiplication circuit for multiplying the input signal and the first signal;
   second means for obtaining a second signal delayed with respect to an output signal from said multiplication circuit by a time equal to or shorter than a time obtained by subtracting a delay time of said first means from T; and
   an addition circuit for adding the output signal from said multiplication circuit and the second signal.

7. A delay-type FM demodulation circuit according to claim 6, wherein
   said first means is a first delay circuit for delaying the input signal by a time which is an eighth of a carrier wave period; and
   said second means is a second delay circuit for delaying the output signal from said multiplication circuit by a time which is an eighth of the carrier wave period.

* * * * *